United States Patent
Park et al.

(10) Patent No.: US 9,666,304 B2
(45) Date of Patent: May 30, 2017

(54) METHOD OF TESTING SEMICONDUCTOR MEMORY DEVICE, TEST DEVICE, AND COMPUTER READABLE RECORDING MEDIUM FOR RECORDING TEST PROGRAM FOR SEMICONDUCTOR MEMORY DEVICE

(71) Applicants: Sea Eun Park, Hwaseong-si (KR); Sung Hee Yun, Seoul (KR)

(72) Inventors: Sea Eun Park, Hwaseong-si (KR); Sung Hee Yun, Seoul (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 58 days.

(21) Appl. No.: 14/676,395

(22) Filed: Apr. 1, 2015

(65) Prior Publication Data

US 2015/0287476 A1 Oct. 8, 2015

(30) Foreign Application Priority Data

Apr. 2, 2014 (KR) .................. 10-2014-0039435

(51) Int. Cl.
| | |
|---|---|
| G11C 29/00 | (2006.01) |
| G01R 31/28 | (2006.01) |
| G11C 29/44 | (2006.01) |
| G11C 29/02 | (2006.01) |
| G11C 29/50 | (2006.01) |

(52) U.S. Cl.
CPC ............ *G11C 29/44* (2013.01); *G11C 29/006* (2013.01); *G11C 29/028* (2013.01); *G11C 29/50* (2013.01); *G11C 2029/5002* (2013.01)

(58) Field of Classification Search
CPC ..... G11C 29/44; G11C 29/006; G11C 29/028; G11C 29/50; G11C 2029/5002
See application file for complete search history.

(56) References Cited

U.S. PATENT DOCUMENTS

| | | | |
|---|---|---|---|
| 6,349,240 B2 * | 2/2002 | Ogawa .................. | 257/E21.525 |
| 7,010,451 B2 | 3/2006 | Dorough et al. | |
| 7,035,447 B2 | 4/2006 | Take | |
| 7,665,048 B2 | 2/2010 | Chan et al. | |
| 7,676,775 B2 * | 3/2010 | Chen .................. | G01R 31/2894 |
| | | | 716/136 |
| 7,865,325 B2 | 1/2011 | Lee et al. | |
| 8,017,411 B2 | 9/2011 | Sonderman et al. | |
| 8,041,541 B2 | 10/2011 | Buxton et al. | |
| 8,134,681 B2 | 3/2012 | Okita | |
| 2008/0172190 A1 * | 7/2008 | Lee .................... | G01R 31/3004 |
| | | | 702/59 |
| 2011/0202711 A1 | 8/2011 | Yang et al. | |

FOREIGN PATENT DOCUMENTS

| | | |
|---|---|---|
| JP | 2005-291758 A | 10/2005 |
| JP | 2010-239041 A | 10/2010 |

* cited by examiner

*Primary Examiner* — Christine Tu
(74) *Attorney, Agent, or Firm* — Sughrue Mion, PLLC

(57) ABSTRACT

A method of testing a semiconductor memory device is provided. The method includes performing a test according to a plurality of cases corresponding to a first generation and generating modeled test results for the plurality of cases, determining optimum cases from among the plurality of cases based on the modeled test results, and generating a plurality of cases corresponding to a second generation based on the optimum cases.

20 Claims, 12 Drawing Sheets

METHOD OF TESTING SEMICONDUCTOR MEMORY DEVICE, TEST DEVICE, AND COMPUTER READABLE RECORDING MEDIUM FOR RECORDING TEST PROGRAM FOR SEMICONDUCTOR MEMORY DEVICE

CROSS-REFERENCE TO RELATED APPLICATION(S)

This application claims priority from Korean Patent Application No. 10-2014-0039435 filed on Apr. 2, 2014, the disclosure of which is hereby incorporated by reference in its entirety.

BACKGROUND

1. Field

Methods and apparatuses consistent with exemplary embodiments relate to testing semiconductor memory devices and, more particularly, to a semiconductor memory device testing method by which an optimum operating condition for a semiconductor memory device in a wafer state is extracted.

2. Description of Related Art

Semiconductor memory devices are divided into volatile memory devices and non-volatile memory devices according to whether or not stored data is lost when power supply to the device is interrupted. Operation modes of non-volatile memory devices are divided into a write mode or program mode in which data is stored in memory cells, a read mode in which data is read from memory cells, and an erase mode in which stored data is erased from memory cells. These operational characteristics and other various characteristics such as characteristics of manufacturing processes and structural characteristics need to be considered when developing non-volatile memory devices for efficiently storing data.

In manufacturing non-volatile memory devices, tests are performed during a wafer stage in order to understand optimum operating conditions. When taking various operating conditions into account, tests are usually performed depending on an engineer's know how since the number of tests is restricted. As a result, there is a disadvantage in that it is highly likely that operating conditions other than operating conditions that are actually optimum are chosen as optimum conditions.

SUMMARY

According to an aspect of an exemplary embodiment, there is provided a method of testing a semiconductor memory device, the method including performing a test on the semiconductor memory device according to a plurality of cases corresponding to a first generation and generating a modeled test result for each of the plurality of cases, determining optimum cases from among the plurality of cases based on the modeled test results, and generating a plurality of cases corresponding to a second generation based on the optimum cases.

According to an aspect of another exemplary embodiment, there is provided a method of testing a semiconductor memory device, the method including determining optimum cases based on a modeled test result corresponding to a result of performing a test on the semiconductor memory device based on a plurality of cases corresponding to a first generation; and generating a plurality of cases corresponding to a second generation based on the optimum cases, wherein the plurality of cases corresponding to the first generation comprise optimum cases of a previous generation before the first generation and test cases respectively corresponding to the optimum cases of the previous generation, and the determining the optimum cases comprises comparing a modeled test result corresponding to the optimum cases of the previous generation with a modeled test result corresponding to the test cases respectively corresponding to the optimum cases of the previous generation; and determining the optimum cases for the first generation according to a result of the comparing.

According to aspect of another exemplary embodiment, there is provided a computer readable recording medium having recorded thereon a test program, the test program including a test operator configured to perform a test according to a plurality of cases corresponding to a first generation and to generate modeled test results for the plurality of cases; an optimizer configured to determine optimum cases from among the plurality of cases based on the modeled test results; and a case generator configured to generate a plurality of cases corresponding to a second generation based on the optimum cases.

According to an aspect of another exemplary embodiment, there is provided a test device including a test operator configured to perform a test according to a plurality of cases corresponding to a first generation and to generate modeled test results for the plurality of cases; an optimizer configured to determine optimum cases from among the plurality of cases based on the modeled test results; and a case generator configured to generate a plurality of cases corresponding to a second generation based on the optimum cases.

According to an aspect of another exemplary embodiment, there is provided a test device for testing a semiconductor memory device, the test device including a processor configured to execute a test program based on input data; and a memory configured to store output data generated from the execution of the test program, wherein the input data comprises at least one among information about operating conditions for the semiconductor memory device, a variable range of each of the operation conditions, an objection function, and an optimum case determination number.

According to an aspect of another exemplary embodiment, there is provided a method of testing a semiconductor memory device, the method including randomly generating a plurality of test cases within a specified range of values; and performing a plurality of iterations of the following: performing a test on the semiconductor memory device according to the plurality of test cases and generating modeled test results for the test cases; determining optimum test cases from among the test cases based on the modeled test results; and generating a plurality of new test cases based on the determined optimum test cases.

BRIEF DESCRIPTION OF THE DRAWINGS

The above and other aspects will become more apparent by describing in detail exemplary embodiments with reference to the attached drawings in which.

DETAILED DESCRIPTION

Figure 1:
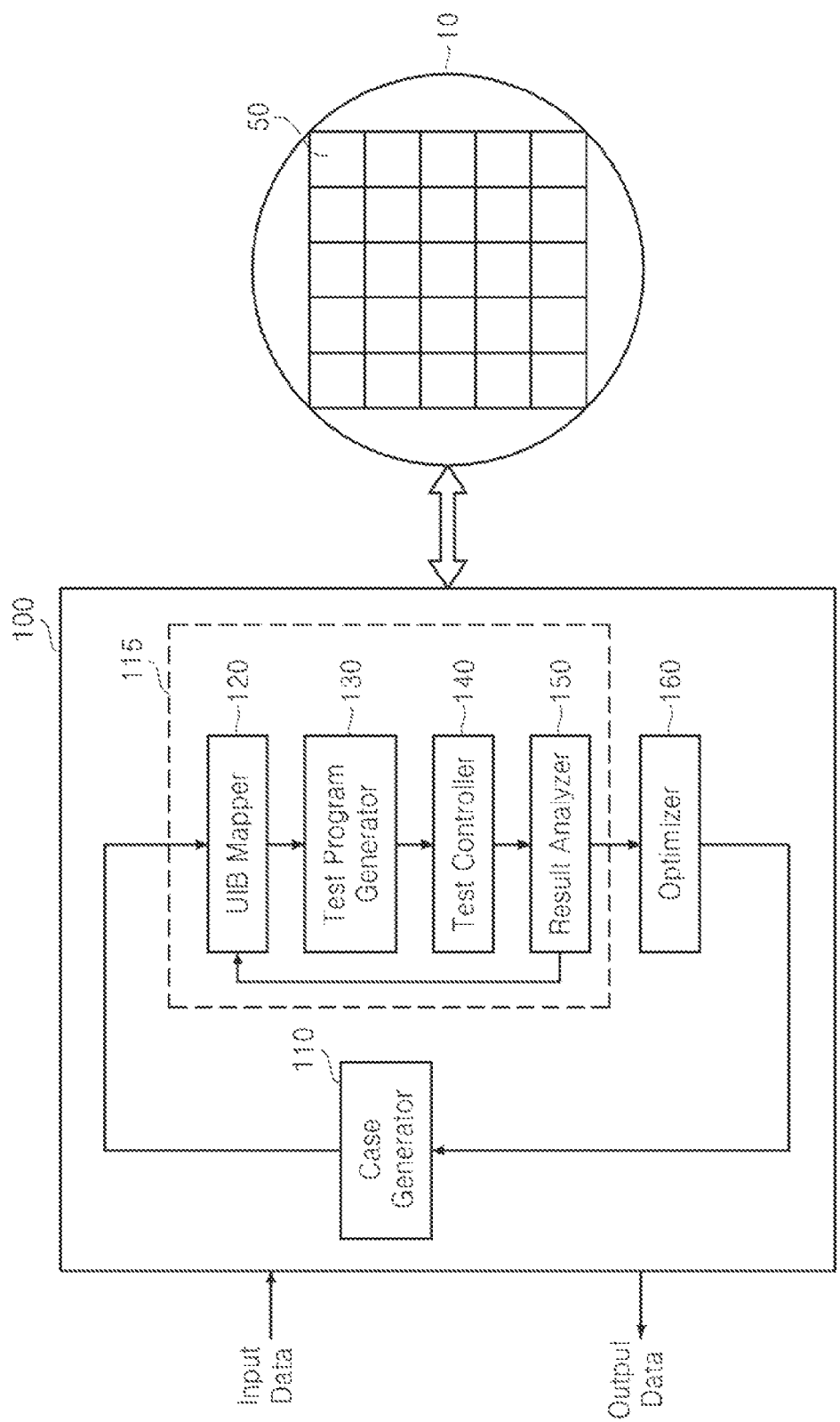
FIG. 1 is a block diagram of a test device according to an exemplary embodiment.

Exemplary embodiments now will be described more fully hereinafter with reference to the accompanying drawings, in which various exemplary embodiments are shown. The inventive concept may, however, be embodied in many different forms and should not be construed as limited to the exemplary embodiments set forth herein. Rather, these exemplary embodiments are provided so that this disclosure will be thorough and complete, and will fully convey the inventive concept to those skilled in the art. In the drawings, the size and relative sizes of layers and regions may be exaggerated for clarity. Like numbers refer to like elements throughout.

It will be understood that when an element is referred to as being "connected" or "coupled" to another element, it can be directly connected or coupled to the other element, or intervening elements may be present. In contrast, when an element is referred to as being "directly connected" or "directly coupled" to another element, there are no intervening elements present. As used herein, the term "and/or" includes any and all combinations of one or more of the associated listed items and may be abbreviated as "/".

It will be understood that, although the terms "first," "second," etc. may be used herein to describe various elements, these elements should not be limited by these terms. These terms are only used to distinguish one element from another. For example, a "first" signal could be termed a "second" signal, and, similarly, a "second" signal could be termed a "first" signal without departing from the teachings of the disclosure.

The terminology used herein is for the purpose of describing particular exemplary embodiments only and is not intended to be limiting. As used herein, the singular forms "a", "an" and "the" are intended to include the plural forms as well, unless the context clearly indicates otherwise. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Unless otherwise defined, all terms (including technical and scientific terms) used herein have the same meaning as commonly understood by one of ordinary skill in the art to which the present inventive concept belongs. It will be further understood that terms, such as those defined in commonly used dictionaries, should be interpreted as having a meaning that is consistent with their meaning in the context of the relevant art and/or the present application, and will not be interpreted in an idealized or overly formal sense unless expressly so defined herein.

FIG. 1 is a block diagram of a test device according to an exemplary embodiment. A test device 100 is for testing semiconductor memory devices in a wafer state. A wafer 10 includes a plurality of dies 50, which may be semiconductor memory devices 50. Although a 5×5 array of dies is shown in FIG. 1, it will be understood by one of ordinary skill in the art that the geometric shape and the number of dies are not particularly limited.

A test operation is for determining optimum operating conditions for each semiconductor memory device 50 when each of the semiconductor memory devices 50 operates after being separated from the wafer 10 and mounted to a module. In other words, the semiconductor memory devices 50 are set to the same optimum operating conditions determined through the test operation in the wafer state and then are cut into dies. When the optimum operating conditions are set wrong, the yield and reliability of the semiconductor memory devices 50 may decrease. Accordingly, correctly determining the optimum operating conditions increases the yield and reliability of the semiconductor memory devices 50.

The semiconductor memory devices 50 may be implemented using non-volatile memory or volatile memory. The non-volatile memory may be memory, such as programmable read-only memory (PROM), erasable PROM (EPROM), electrically EPROM (EEPROM), flash memory, or phase-change random access memory (PRAM), which retains data regardless of whether power is supplied or not. The volatile memory may be memory, such as dynamic random access memory (DRAM) or static RAM (SRAM), which retains data only while power is being supplied.

The test device 100 may run the dies 50 using predetermined operating conditions, analyze output values, and determine optimum operating conditions. The test device 100 may include a case generator 110, a test operator 115, and an optimizer 160. The test device 100 may operate after receiving input data including basic information used for the operation of the test device 100 from an outside, e.g., a user. The input data may include one or more of information about operating conditions, variable ranges of the operation conditions, an objection function, and an optimum case determination number "p", which will be described later.

The test device 100 may provide an outside, e.g., a user, output data corresponding to a result of a test operation. The output data may include one or more of a test result, a modeled test result, optimum cases, and a final optimum case.

The case generator 110 may generate and provide a plurality of cases for the test operator 115. The cases may include information about operating conditions for the semiconductor memory devices 50. The operating conditions include conditions of time values and voltage values such as a reference voltage, a program voltage, a read voltage, a pass voltage, and an erase voltage, etc., that are used in operating the semiconductor memory devices 50.

The case generator 110 may randomly generate a plurality of cases corresponding to a first generation when a test operation starts. Randomly generating denotes that operating conditions of each case have random values within a range determined by a user. The range may be predetermined. For instance, a read voltage in one case among the cases corresponding to the first generation may have a random value of 1.6 V within a range of 0.5 to 2.0 V set by the user in the case generator 110, whereas a read voltage in another case may have a random value of 0.7 V within the range of 0.5 to 2.0 V, and in another case the read voltage may be 1.7 V with the range of 0.5 to 2.0 V, etc., where the voltages 1.6 V, 0.7 V, and 1.7 V are selected at random within the 0.5 to 2.0 V range set by the user.

During the test operation, the case generator 110 may receive optimum cases of a previous generation from the optimizer 160 and generate test cases using a randomizing method. The randomizing method denotes a method of generating test cases based on the optimum cases of the previous generation, but where the generated test cases are different from the optimum cases of the previous generation. Here, mutation and recombination will be described as the randomizing method with reference to FIGS. 5 and 6, but the inventive concept is not restricted thereto. The optimum cases of the previous generation and the newly generated test cases may be provided as cases corresponding to a next generation for the test operator 115. For instance, when the case generator 110 generates test cases based on optimum cases among a plurality of cases corresponding to the first generation, the optimum cases and the generated test cases may be provided as cases corresponding to the second generation for the test operator 115. Here, the first generation and the second generation are relative concepts. A generation of cases provided by the case generator 110 may be different depending on which generation is set as a reference. Mutation and recombination performed by the case generator 110 will be described with reference to FIGS. 5 and 6 later.

The test operator 115 may perform a test according to each of the cases corresponding to each generation, which are provided from the case generator 110, and may generate a test result and a modeled test result with respect to each case. The test operator 115 may include a universal internal bus (UIB) mapper 120, a test program generator 130, a test controller 140, and a result analyzer 150.

The UIB mapper 120 may map operating conditions of each of cases corresponding to a generation, which are provided from the case generator 110, to UIB information. The UIB information is information (e.g., UIB address and UIB value) that can be recognized by the semiconductor memory devices 50. The UIB mapper 120 may map an item (e.g., a read voltage) of an operating condition and a specific value (e.g., 1.6 V) to corresponding UIB information so that the semiconductor memory devices 50 operate using the operating condition.

The test program generator 130 may generate a test program corresponding to each of the cases using the operating conditions mapped by the UIB mapper 120. In other words, the test program generator 130 may generate a program for executing a test operation of the semiconductor memory devices 50 using the mapped operating conditions as new variables for each case. When generating the test program, the test program generator 130 may give the test program a block moving function and a block mixing function. The block moving function and block mixing function will be described in detail with reference to FIGS. 3, 7, and 8 later.

In addition, the test program generator 130 may generate the test program so that a test operation is not performed for optimum cases of a previous generation right before a current generation among the plurality of cases. This may be advantageous in a situation in which a test operation for the optimum cases of the previous generation has already been performed and a test result or modeled test result based on the test operation has already been stored in the result analyzer 150.

The test controller 140 may perform compiling so that the test program generated by the test program generator 130 is run in the test device 100 and may control the test operation of the test device on the semiconductor memory devices 50. In addition, the test controller 140 may extract a result of the test operation. In other words, the test controller 140 may perform a test on the semiconductor memory devices 50, and more particularly, on memory blocks included in the semiconductor memory devices 50 according to the test program.

The test controller 140 may also control the optimizer 160 to output an optimum case of a p-th generation as a final optimum case, where "p" is a positive integer and may be determined (and included in input data) by a user. The positive integer "p" may be predetermined. For instance, when "p" is 10, the test controller 140 may control the optimizer 160 to output an optimum case, which has been determined based on a modeled test result obtained with respect to a plurality of cases of the 10th generation, as a final optimum case. Alternatively, the positive integer "p" may be determined automatically based on a test result or modeled test result. For example, the test controller 140 may evaluate an output value of an optimum case against a threshold value (e.g., to determine convergence of the final optimum case to the threshold value) and continue with generating subsequent generations if the final optimum case does not meet the threshold value (e.g., in the case of convergence, if the final optimum case has not converged to within the threshold value). Moreover, "p" may be set initially by the user and then changed automatically based on a test result or modeled test result. For example, the test controller 140 may iterate through "p" generations and then evaluate an output value of an optimum case after the p-th generation against a threshold, and increase "p" if the value of the optimum cases does not meet the threshold value. Thus, "p" may be manually or automatically changed during the execution of the test program.

The result analyzer 150 may analyze a test operation result received from the test controller 140 and generate a test result in a database. The test result may include characteristic information such as characteristics of each die 50, which include characteristics of each memory cell, and a deviation of a characteristic among the dies 50. The characteristics of each die 50 may include a cell distribution characteristic of a memory cell, the number of fail bits per word line, a programming time, etc.

The better the cell distribution characteristic, the more likely it is that the reliability of the semiconductor memory devices 50 is high, and the less the deviation of the cell distribution characteristics among the dies 50, the more likely it is that the yield of the semiconductor memory devices 50 is high.

The number of fail bits per word line, which is hereinafter referred to as "FBWL", indicates the number of bits for which a fail, i.e., inconsistency between programmed data and read data, occurs in a word line. It can be said that the lower the FBWL characteristic, the higher the reliability of the semiconductor memory devices 50, and the lower the deviation of the FBWL characteristic among the dies 50, the higher the yield of the semiconductor memory devices 50.

The programming time, which is hereinafter referred to as "tPROG", indicates a time taken for a memory cell to be completely programmed. It can be said that the lower the tPROG characteristic, the higher the operation speed of the semiconductor memory devices 50, and the lower the deviation of the tPROG characteristic among the dies 50, the higher the yield of the semiconductor memory devices 50.

The result analyzer 150 may store the test result by items of the characteristic information and may store multiple items of the characteristic information for each of the dies 50. The result analyzer 150 may provide the test result to an outside (e.g., a user). The user may monitor the test result and may verify and revise an optimum case through analysis based on the test result after the optimum case has been determined by the test device 100.

The result analyzer 150 may also generate a modeled test result by modeling the test result using an objection function. The result analyzer 150 may provide the modeled test result to the optimizer 160 or an outside (e.g., a user). The objection function converts a test result for a case (or characteristic information item) into a comparable figure and it may be included in input data received by the test device 100.

The operation of the result analyzer 150 generating the modeled test result will be described in detail with reference to FIGS. 3, 9, and 10. The generation of the test result may be performed sequentially and iteratively by the UIB mapper 120, the test program generator 130, the test controller 140, and the result analyzer 150 with respect a plurality of cases corresponding to each generation. For instance, when the UIB mapper 120 receives 10 cases of a first generation, a test result for the first case may be generated and then test results for the respective second through 10th cases may be sequentially and circularly generated.

The optimizer 160 may determine optimum cases from among the cases of each generation based on the modeled test result. The optimizer 160 may provide the selected optimum cases to an outside, e.g., to a user. The operation of the optimizer 160 determining the optimum cases will be described in detail with reference to FIG. 4 later.

When the optimizer 160 determines optimum cases based on the modeled test result for each of a plurality of cases corresponding to the p-th generation according to the control of the test controller 140, the optimizer 160 may output the optimum cases as final optimum cases.

The case generator 110, the test operator 115, the UIB mapper 120, the test program generator 130, the test controller 140, the result analyzer 150, and the optimizer 160 are illustrated in FIG. 1, for clarity of the description. However, it will be understood that additional elements may be provided in the test device 100. In addition, the case generator 110, the test operator 115, the UIB mapper 120, the test program generator 130, the test controller 140, the result analyzer 150, and the optimizer 160 may be implemented in software, hardware, or a combination thereof to perform their own functions. The case generator 110, the test operator 115, the UIB mapper 120, the test program generator 130, the test controller 140, the result analyzer 150, and the optimizer 160 may constitute a test program for the semiconductor memory devices 50. The test program may be recorded in a computer readable recording medium, i.e., memory (e.g., RAM, ROM, hard disk, or non-volatile memory) and may be executed by a processor (e.g., a central processing unit (CPU)) or computer. In this later case, the wafer 10 would be placed into a test fixture, and one or more probes would be placed into contact with the wafer 10. The test program would then be run by the CPU in order to test the semiconductor memory devices 50 in conjunction with the probes and wafer 10.

Figure 2:
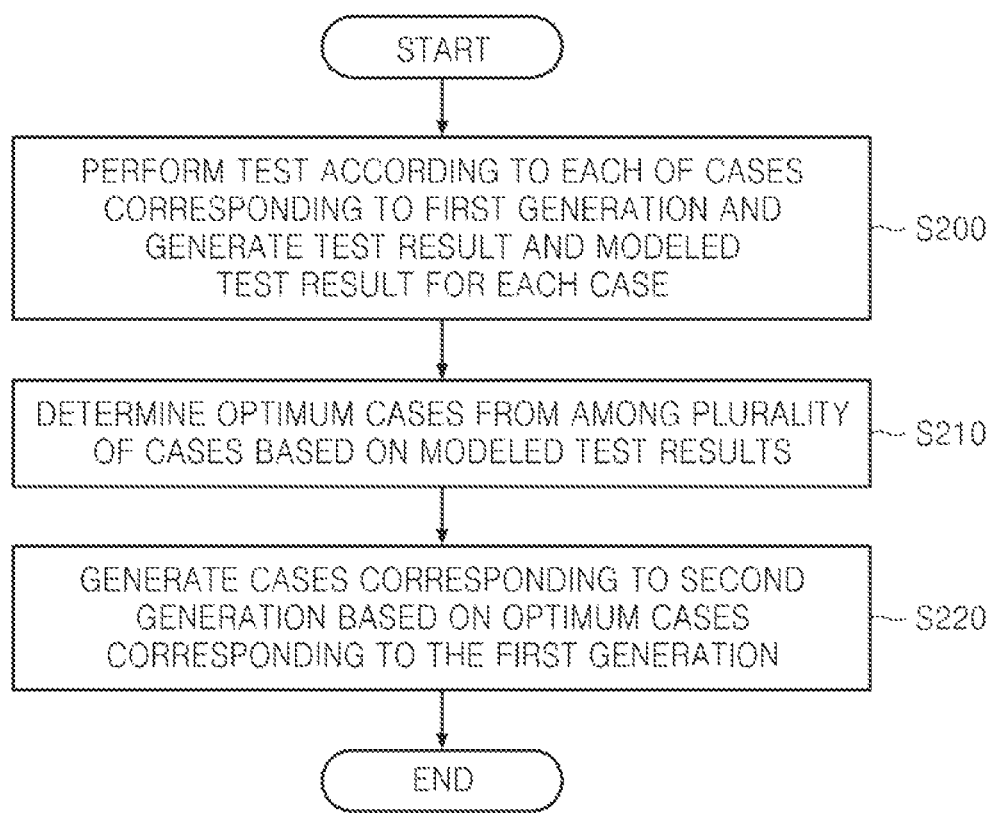
FIG. 2 is a flowchart of a method of operating the test device illustrated in FIG. 1, according to an exemplary embodiment.
Figure 4:
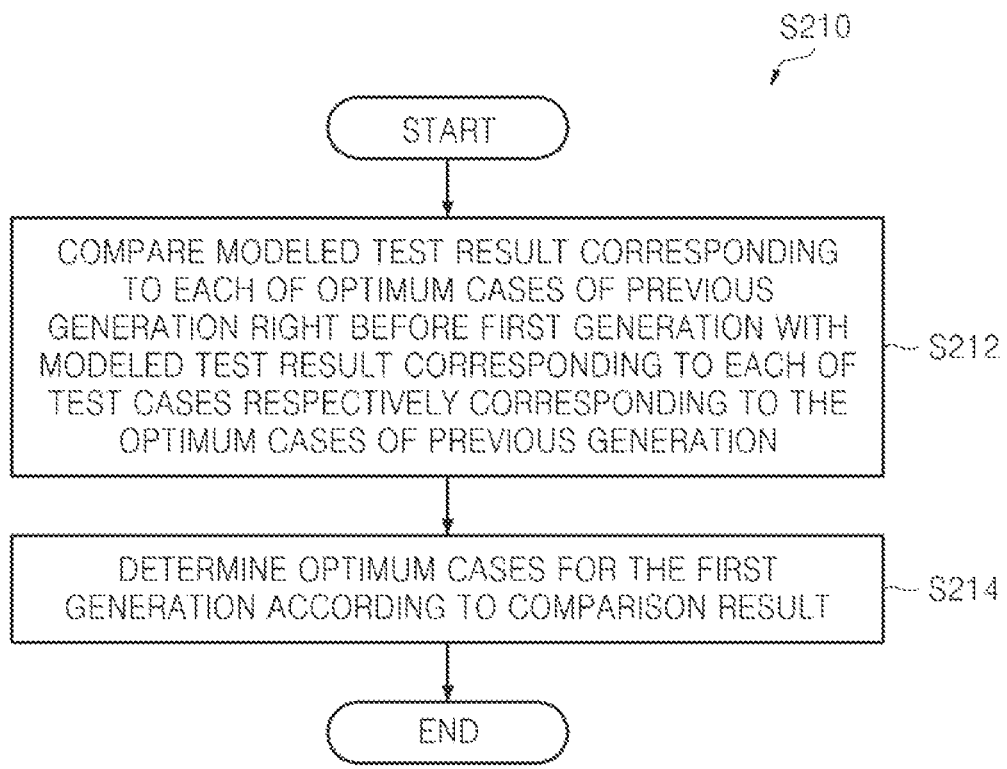
FIG. 4 is a detailed flowchart of an operation of determining optimum cases in the method illustrated in FIG. 2, according to an exemplary embodiment.
Figure 5:
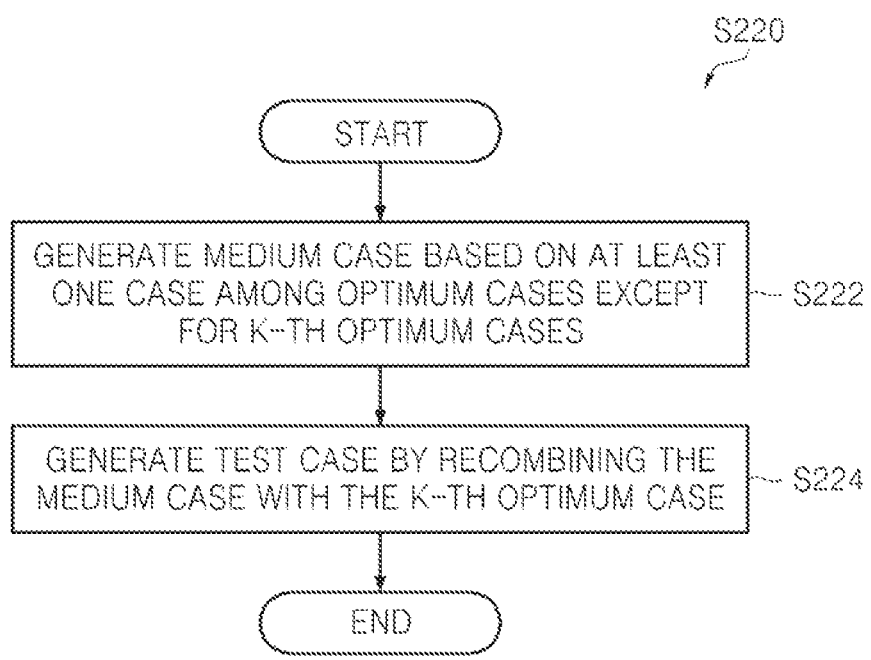
FIG. 5 is a detailed flowchart of an operation of generating a plurality of cases corresponding to a second generation in the method illustrated in FIG. 2, according to an exemplary embodiment.
Figure 6:
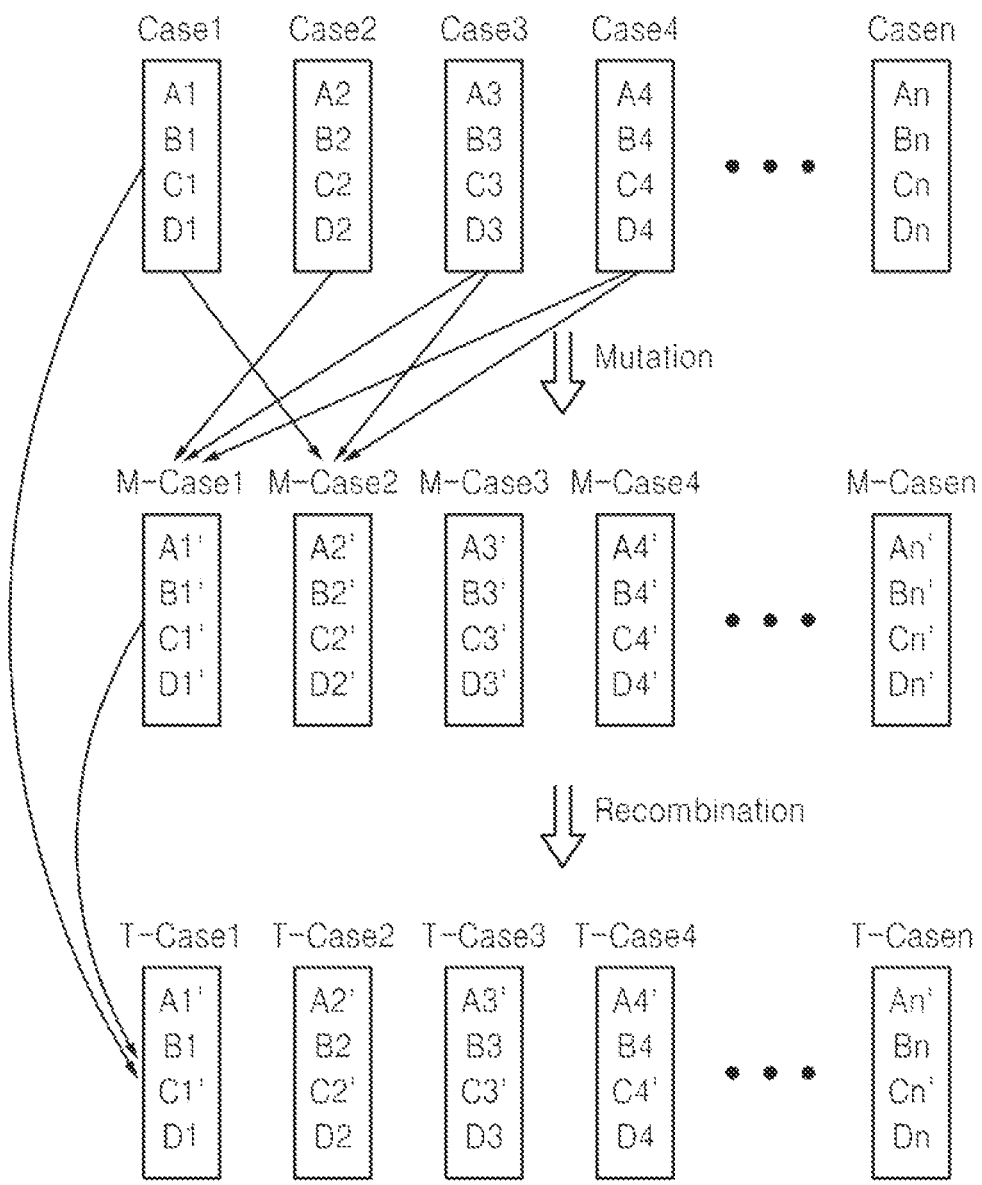
FIG. 6 is a diagram for explaining the operation of a case generator illustrated in FIG. 1, according to an exemplary embodiment.
Figure 7:
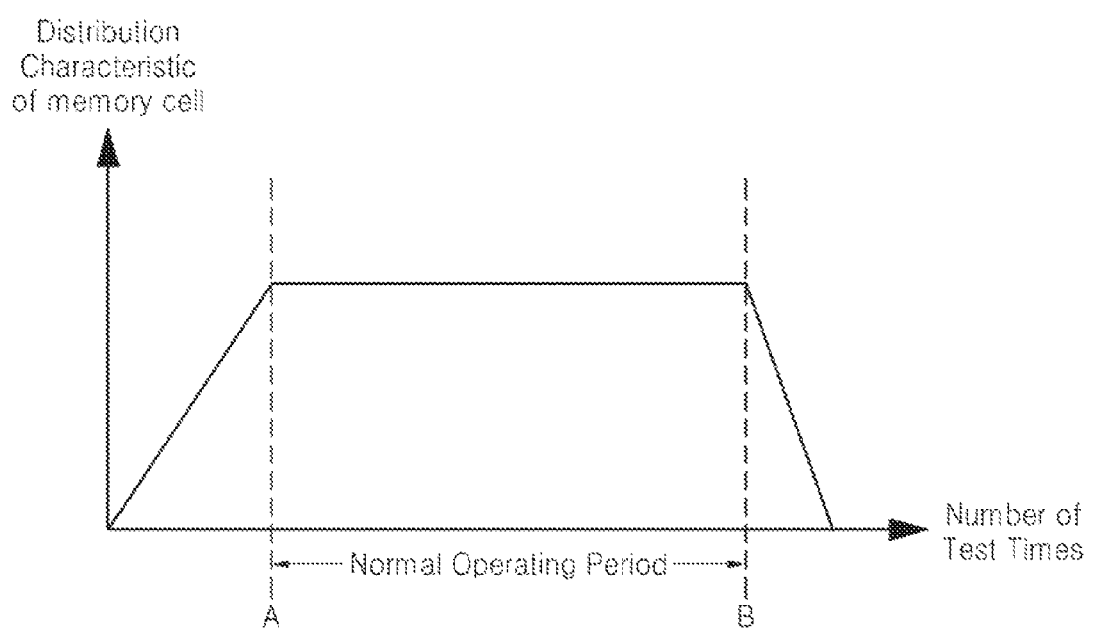
FIG. 7 is a diagram illustrating the change in a characteristic of a memory cell over time, according to an exemplary embodiment.
Figure 8:
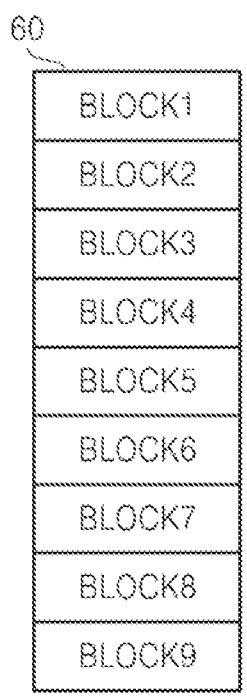
FIG. 8 is a diagram for explaining the operation of a test program generator using the change in the characteristic of the memory cell illustrated in FIG. 7, according to an exemplary embodiment.

FIG. 2 is a flowchart of a method of operating the test device 100 illustrated in FIG. 1, according to an exemplary embodiment. FIG. 3 is a detailed flowchart of an operation of generating a test result in the method illustrated in FIG. 2, according to an exemplary embodiment. FIG. 4 is a detailed flowchart of an operation of determining optimum cases in the method illustrated in FIG. 2, according to an exemplary embodiment. FIG. 5 is a detailed flowchart of an operation of generating a plurality of cases corresponding to a second generation in the method illustrated in FIG. 2, according to an exemplary embodiment. FIG. 6 is a diagram for explaining the operation of the case generator 110 illustrated in FIG. 1, according to an exemplary embodiment. FIG. 7 is a diagram illustrating the change in a characteristic of a memory cell over time, according to an exemplary embodiment. FIG. 8 is a diagram for explaining the operation of the test program generator 130 using the change in the characteristic of the memory cell illustrated in FIG. 7, according to an exemplary embodiment. FIG. 9 is a diagram showing cell distribution to explain the operation of the result analyzer 150 illustrated in FIG. 1, according to an exemplary embodiment. FIG. 10 is a diagram showing the FBWL to explain the operation of the result analyzer 150 illustrated in FIG. 1, according to an exemplary embodiment. FIG. 11 is a diagram showing the deviation of an average characteristic among a plurality of dies to explain the operation of the result analyzer 150 illustrated in FIG. 1, according to an exemplary embodiment.

In describing the operation of the test device 100 with reference to FIGS. 1 through 11, it is assumed that a first generation comes after an optimum case has been determined by the optimizer 160 at least once.

Referring to FIGS. 1 and 2, the test operator 115 may perform a test according to each of a plurality of cases corresponding to the first generation and generate a test result and a modeled test result with respect to each case in operation S200. Operation S200 may include operations S202 through S208 illustrated in FIG. 3.

Figure 3:
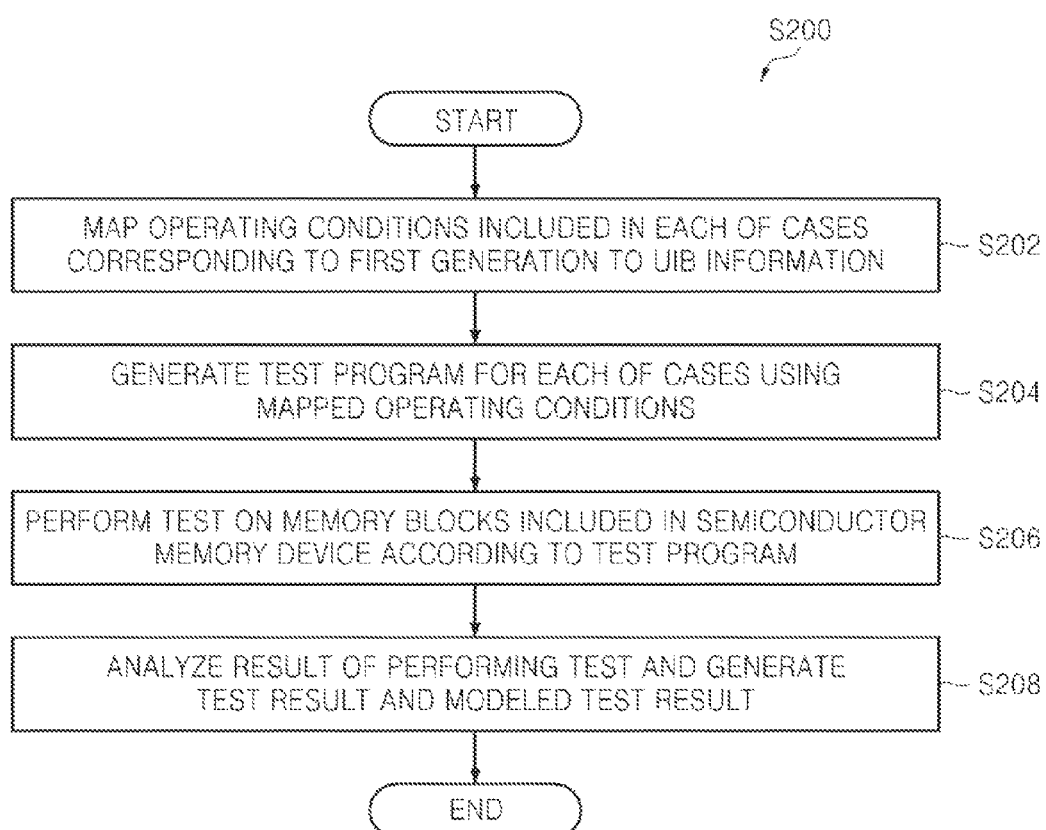
FIG. 3 is a detailed flowchart of an operation of generating a test result in the method illustrated in FIG. 2, according to an exemplary embodiment.

Referring to FIGS. 1 and 3, the UIB mapper 120 may map operating conditions included in each of the cases corresponding to the first generation to UIB information in operation S202. The test program generator 130 may generate a test program for each of the cases using the operating conditions mapped to the UIB information in operation S204. When generating the test program, the test program generator 130 may give the test program a block moving function and a block mixing function. The block moving function and the block mixing function are related with the deterioration and block variation of memory cells included in the semiconductor memory devices 50.

As shown in FIG. 7, a cell characteristic is not good until a test operation is performed on a memory cell A times, e.g., A=100 times, and after a test operation is performed on the memory cell B times, e.g., B=10000 times. The "number of test times" presented in FIG. 7 indicates the number of test operations performed on one memory cell. Reference characters A and B denote positive integers which are values depending on the structure of the memory cell and the processes of the wafer 10. The values may be stored in the test device 100 and may be changed by a user input.

When a section between when the number of test times is A and when the number of test times is B is defined as a normal operating period, a normal test result can be obtained only when a test operation on the memory cell is performed in the normal operating period. The normal operating period denotes a period in which a normal test result can be obtained without deterioration and the normal operating period may be expressed as the number of test times. When the number of test times exceeds B, a normal test result cannot be obtained due to the deterioration of the memory cell. Therefore, a memory block to be tested in the semiconductor memory devices 50 is changed in order to allow a test operation to be performed on a memory cell in the normal operating period. A function of changing a memory block in in order to allow a test operation to be performed on a memory cell in the normal operating period is referred to as a block moving function.

It is assumed that a memory cell array 60 included in each of the semiconductor memory devices 50 includes nine memory blocks BLOCK1 through BLOCK9, as shown in FIG. 8. It is also assumed that three memory blocks are tested at a time.

Each of the memory blocks BLOCK1 through BLOCK9 includes a plurality of memory cells. Since a test operation is performed on a memory cell in the normal operating period in order to obtain a normal test result, the test operator 115 may perform a test operation on the first through third memory blocks BLOCK1 through BLOCK3 after a dummy test operation is performed A times on the first through third memory blocks BLOCK1 through BLOCK3. The dummy test operation is not performed by the test operator 115, but the same operation as a test operation is repeated so that a memory cell enters the normal operating period.

When a memory cell goes beyond the normal operating period after the normal test operation is repeated on the first through third memory blocks BLOCK1 through BLOCK3, target memory blocks of the test operation may be changed to the fourth through sixth memory blocks BLOCK4 through BLOCK6. In order to reduce a total test time, a dummy test operation may be performed on the fourth through sixth memory blocks BLOCK4 through BLOCK6 while the normal test operation is being performed on the first through third memory blocks BLOCK1 through BLOCK3.

In the same manner, when a memory cell goes beyond the normal operating period after the normal test operation is repeated on the fourth through sixth memory blocks BLOCK4 through BLOCK6, target memory blocks of the test operation may be changed to the seventh through ninth memory blocks BLOCK7 through BLOCK9. Although the description has been made with respect to only nine memory blocks BLOCK1 through BLOCK9 in the exemplary embodiment illustrated in FIG. 8, this is only an example and the number of memory blocks is not particularly limited. Additionally, the number of memory blocks tested at a time has been described as three. However, this number is only an example and the number of memory blocks tested at a time is not particularly limited.

In other exemplary embodiments, when it is assumed that the memory cell array 60 included in each semiconductor memory device 50 may include several thousand memory blocks, four blocks are tested at a time, and groups of four blocks are sequentially tested from the top of the memory cell array 60; a block deviation may occur between memory blocks apart far from each other in the memory cell array 60 due to a characteristic difference such as a difference in cell distribution characteristic. In other words, when a test operation on four blocks is performed sequentially on thousands of blocks from the top of the memory cell array 60, a test result obtained with respect to the first four blocks may be different from a test result obtained with respect to four blocks (e.g., at the bottom of the memory cell array 60) that are physically located far apart from the first four blocks due to the block deviation. Therefore, in order to find out global optimum operating conditions, thousands of memory blocks may be grouped into several regions (a region denotes a group of memory blocks positioned to be adjacent to one another) and memory blocks to be tested may be selected evenly from the regions. For instance, when a test operation is performed in units of four blocks, thousands of memory blocks may be grouped into four regions and four blocks may be selected from four regions, respectively. That is, one block may be selected from the first region, one block may be selected from the second region, one block may be selected from the third region, and one block may be selected from the fourth region. Such an operation of selecting test blocks to prevent an inaccurate test result obtained due to a block deviation is referred to as a block mixing function. A method of grouping memory blocks into regions and a method of selecting memory blocks from the regions may be modified in various ways. To realize the block moving function and the block mixing function, the test program generator 130 may generate a test program so that memory blocks to be tested can be changed when generating the test program for a case using block moving and block mixing.

Returning to FIGS. 1 and 3, the test controller 140 may perform a test operation on memory blocks, e.g., BLOCK1 through BLOCK3, included in at least one of the semiconductor memory devices 50 according to the test program in operation S206. The result analyzer 150 may analyze a result of performing the test operation and generate a test result and a modeled test result in operation S208.

Figure 9:
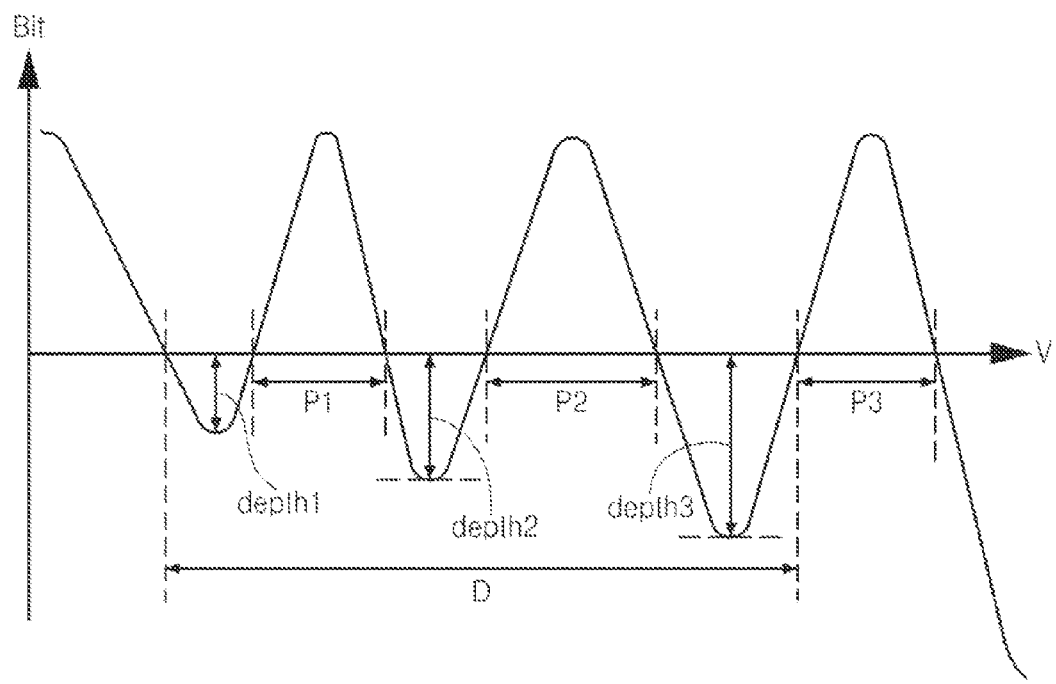
FIG. 9 is a diagram showing cell distribution to explain the operation of a result analyzer illustrated in FIG. 1, according to an exemplary embodiment.

When it is assumed that a distribution of memory cells illustrated in FIG. 9 appears when one of the dies 50 is tested according to the operating conditions of a first case, a test result corresponding to the die 50 and the first case includes distribution characteristic information items P1 through P3, depth1 through depth3, and D as shown in FIG. 9.

The result analyzer 150 may store the distribution characteristic information items P1 through P3, depth1 through depth3, and D to correspond to the die 50 and the first case. In addition, the result analyzer 150 may calculate a comparable figure corresponding to the die 50 and the first case using an objection function which has the distribution characteristic information items P1 through P3, depth1 through depth3, and D as independent variables. The comparable figure indicates an average distribution characteristic corresponding to the die 50 and the first case.

FIG. 11 shows the number of dies versus average characteristic, that is, FIG. 11 shows a deviation of an average characteristic among the dies. The average characteristic of a die may indicate an average distribution characteristic of the die, an average FBWL characteristic of the die, or an average tPROG characteristic of the die. More dies have a second deviation V2 than a first deviation V1 at a certain average characteristic, which indicates the dies with the second deviation V2 will have a better yield than dies having the first deviation V1.

When the deviation of an average characteristic among the dies 50 illustrated in FIG. 11 is a deviation of an average distribution characteristic and corresponds to the first deviation V1, the result analyzer 150 may calculate a comparable figure corresponding to the first case and distribution using an objection function which has the average distribution characteristics of the dies 50 and the first deviation V1 as independent variables.

Figure 10:
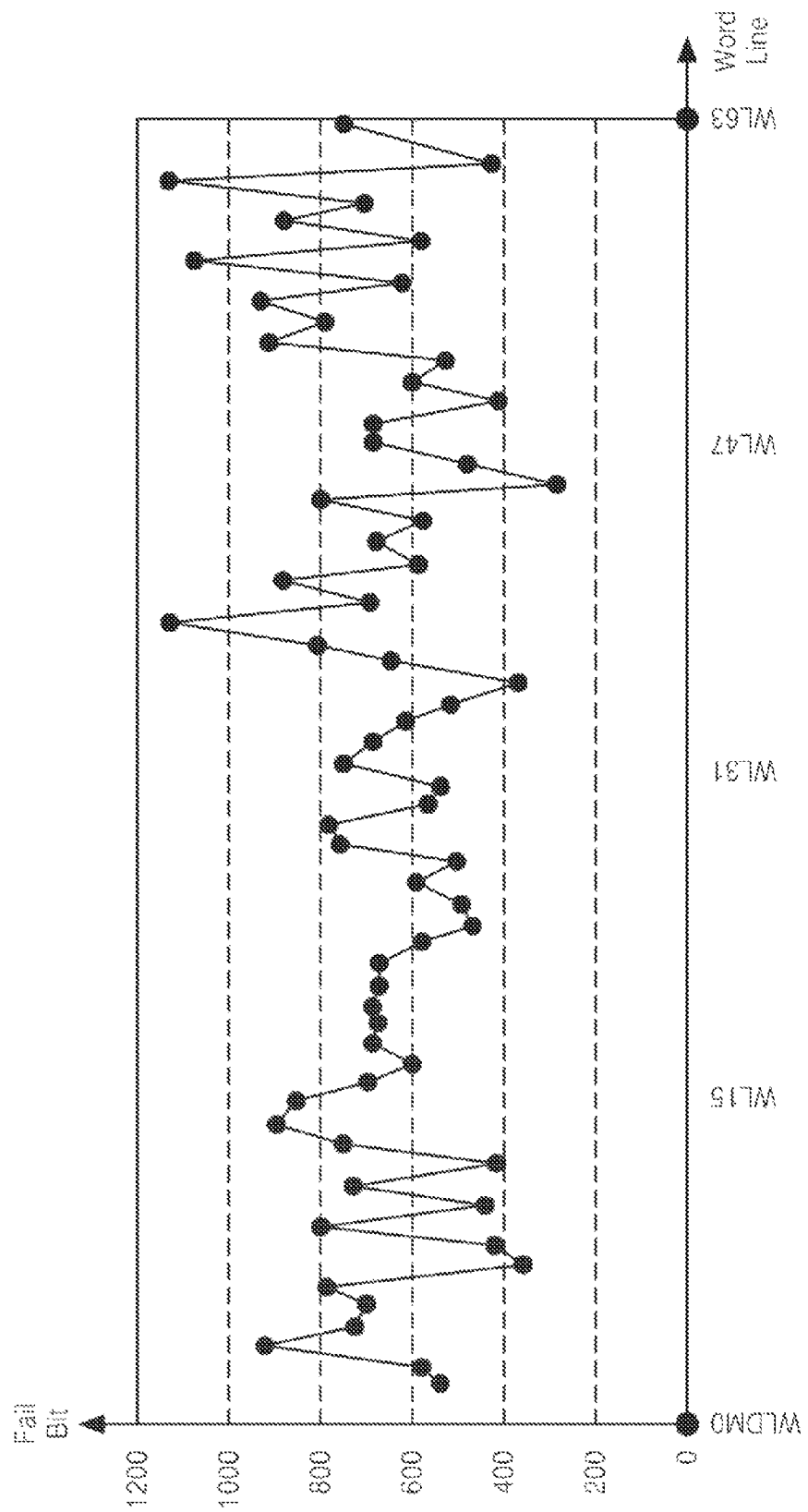
FIG. 10 is a diagram showing the number of fail bits per word line to explain the operation of the result analyzer illustrated in FIG. 1, according to an exemplary embodiment.
Figure 11:
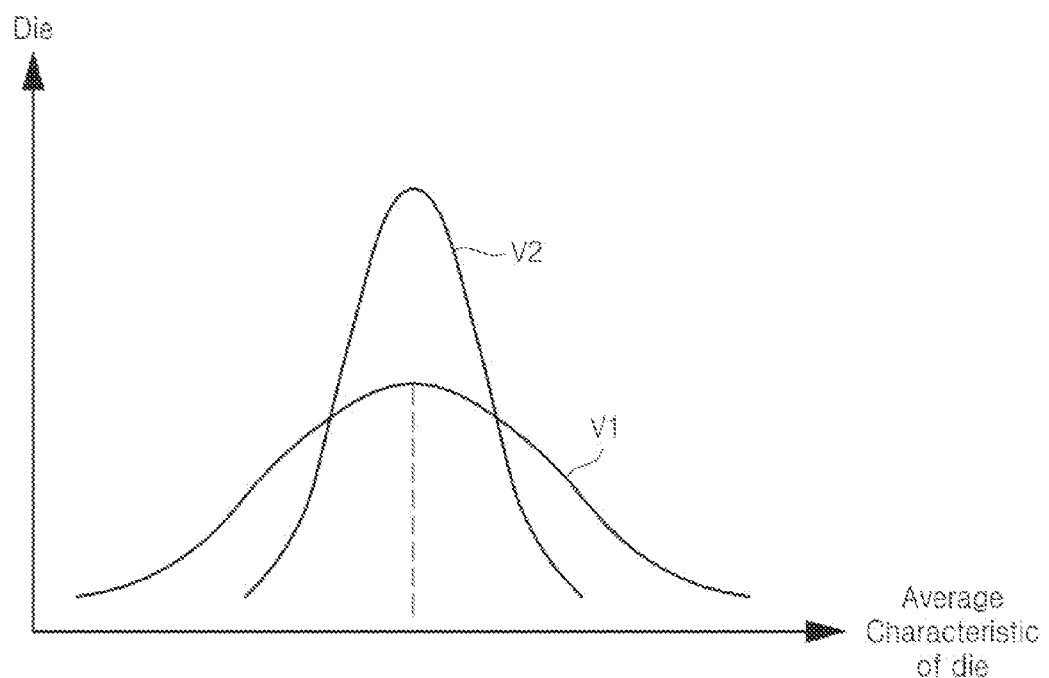
FIG. 11 is a diagram showing the deviation of an average characteristic among a plurality of dies to explain the operation of the result analyzer illustrated in FIG. 1, according to an exemplary embodiment.

When it is assumed that an FBWL distribution illustrated in FIG. 10 appears when one of the dies 50 is tested according to the operating conditions of the first case, the result analyzer 150 may calculate a comparable figure corresponding to the die 50 and the first case using an objection function which has characteristic information of the FBWL distribution as an independent variable. The comparable figure indicates an average FBWL characteristic corresponding to the die 50 and the first case.

When the deviation of an average characteristic among the dies 50 illustrated in FIG. 11 is a deviation of an average FBWL characteristic and corresponds to the second deviation V2, the result analyzer 150 may calculate a comparable figure corresponding to the first case and FBWL using an objection function which has the average FBWL characteristics of the dies 50 and the second deviation V2 as independent variables.

The result analyzer 150 may finally calculate a comparable figure corresponding to the first case using an objection function which has the comparable figure corresponding to the first case and the distribution and the comparable figure corresponding to the first case and the FBWL as independent variables. The final comparable figure corresponding to the first case is calculated taking only distribution and FBWL into account in the above-described exemplary embodiments. However, this is only an example, and the final comparable figure may be calculated taking into account additional parameters.

The result analyzer 150 may model the test result obtained for a memory cell in each of the dies 50 into a comparable figure, i.e., the modeled test result corresponding to each case using an objection function. The objection function is an arbitrary function which may vary with an independent variable and may be defined to indicate a good characteristic when a dependent variable increases or decreases.

Returning to FIGS. 1 and 2, the optimizer 160 may determine optimum cases from among the plurality of cases based on modeled test results in operation S210. Operation S210 may include operations S212 and S214 illustrated in FIG. 4.

Referring to FIGS. 1 and 4, the optimizer 160 may compare a modeled test result corresponding to each of the optimum cases of a previous generation right before the first generation with a modeled test result corresponding to each of test cases respectively corresponding to the optimum cases of the previous generation in operation S212. Each modeled test result is a comparable figure (e.g., a scalar value), so that the optimizer 160 may compare modeled test results of respective cases with each other.

The optimizer 160 may determine the optimum cases according to the comparison result in operation S214. For instance, it is assumed that there are 20 cases corresponding to the first generation and the 20 cases include 10 optimum cases of a previous generation right before the first generation and 10 test cases generated based on the 10 optimum cases. The optimizer 160 may compare a modeled test result for each of the 10 optimum cases with a modeled test result for each of the 10 test cases corresponding to the 10 optimum cases and may determine optimum cases for the first generation. When the first case is an optimum case and the 11th case is a test case generated based on the first case, a modeled test result for the first case may be compared with a modeled test result for the 11th case and a case having the better modeled test result between the first case and the 11th case may be determined as an optimum case for the first generation.

When the first generation is the p-th generation, the optimizer 160 may determine optimum cases based on modeled test results respectively for a plurality of cases corresponding to the first generation according to the control of the test controller 140 and may output the determined optimum cases as final optimum cases. Here, "p" is a positive integer as described above.

Returning to FIGS. 1 and 2, the case generator 110 may generate a plurality of cases corresponding to the second generation based on the optimum cases corresponding to the first generation in operation S220. Operation S220 may include operations S222 and S224 illustrated in FIG. 5.

Referring to FIGS. 1 and 5, the case generator 110 may generate a medium case based on at least one case among the optimum cases of the first generation except for a k-th optimum case in operation S222. It is assumed that the optimum cases of the first generation include "n" optimum cases Case1 through Casen, as shown in FIG. 6. Here, "n" is an integer of at least 2 and "k" is an integer of at least 1 and at most "n".

It is assumed that each of the optimum cases Case1 through Casen include four operating conditions. Here, four operating conditions are illustrated for clarity of the description, but this is only an example, and the number of operating conditions is not particularly limited. The first case Case1 may include four operating conditions A1 through D1, each of which may include a voltage value and a time value corresponding to one of a program voltage, a read voltage, a pass voltage, and an erase voltage.

A medium case M-Casek corresponding to the k-th optimum case Casek may be generated through mutation based on at least one of the optimum cases Case1 through Casen except for the k-th optimum case Casek. For instance, the medium case M-Case1 corresponding to the first optimum case Case1 may be generated based on the second through fourth optimum cases Case2 through Case4. As another example, the medium case M-Case2 corresponding to the second optimum case Case2 may be generated based on the first case Case1, the third case Case3, and the fourth case Case4. As yet another example, the medium case M-Case3 corresponding to the third optimum case Case3 may be generated based on the first case Case1, the second case Case2, and the fourth case Case4, etc.

For the medium case M-Case1, the mutation may be implemented as an operation among vectors respectively corresponding to the second through fourth optimum cases Case2 through Case4 when the first optimum case Case1 corresponds to a vector with four rows and one column. The operation may be randomly determined unless operating conditions have values within a range set by a user. The range may be predetermined.

Returning to FIGS. 1 and 5, the case generator 110 may generate a test case T-Casek by recombining the k-th optimum case Casek and the medium case M-Casek corresponding to the k-th optimum case Casek in operation S224. The recombining the medium case M-Casek and the k-th optimum case Casek may be referred to as recombination, which is an operation of generating a new case by recombining some of operating conditions included in the medium case M-Casek with some of operating conditions included in the k-th optimum case Casek. For instance, a test case T-Case1 corresponding to the first optimum case Case1 may be generated by recombining some conditions B1 and D1 among the operating conditions A1 through D1 included in the first optimum case Case1 with some conditions A1' and C1' among operating conditions A1' through D1' included in the medium case M-Case1 corresponding to the first optimum case Case1.

In the exemplary embodiment illustrated in FIG. 6, each of the test cases T-Case1 through T-Casen is generated by recombining corresponding one of the second operating conditions B1 through Bn respectively included in the optimum cases Case1 through Casen and corresponding one of the fourth operating conditions D1 through Dn respectively included in the optimum cases Case1 through Casen with corresponding one of the first operating conditions A1' through An' respectively included in the medium cases M-Case1 through M-Casen and corresponding one of the third operating conditions C1' through Cn' respectively included in the medium cases M-Case1 through M-Casen. However, this is only an example, and the combination of operating conditions is not particularly limited.

Figure 12:
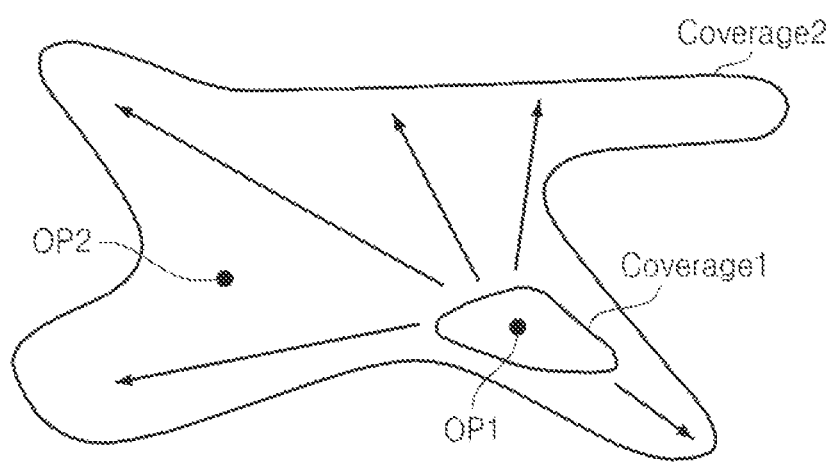
FIG. 12 is a comparison diagram for explaining the effects of the test device illustrated in FIG. 1.

FIG. 12 is a comparative diagram for explaining the effects of the test device 100 illustrated in FIG. 1. Referring to FIGS. 1 through 12, FIG. 12 shows a first coverage Coverage1 indicating a region tested according to a related art test operation and a second coverage Coverage2 indicating a region tested in a test operation performed by the test device 100 according to an exemplary embodiment.

The area of the first coverage Coverage1 corresponds to the range of cases tested in the related art test operation and the area of the second coverage Coverage2 correspond to the range of cases tested in the test operation of the test device 100. The area of the second coverage Coverage2 is much wider than that of the first coverage Coverage1. Accordingly, a second optimum case OP2 determined as an optimum case in the second coverage Coverage2 wider than the first coverage Coverage1 has a better test result than a first optimum case OP1 determined as an optimum case in the first coverage Coverage1.

In order to obtain ideal operating conditions for the semiconductor memory device 50, almost tens of trillions of cases would need to be created using tens of operating conditions and they all would need to be tested. It is actually currently impossible to test all tens of trillions of cases. Thus, in the related art, several hundred cases are selected by an engineer depending on the engineer's know how in related art test operations, and then optimum cases are determined from among the selected cases. The range of the several hundred cases of the related art corresponds to the first coverage Coverage1.

However, in test operations by the test device 100, cases to be tested may be randomly selected from among the tens of trillions of cases through mutation and recombination by the case generator 110. The range of the tens of trillions of cases corresponds to the second coverage Coverage2. In addition, the optimizer 160 selects cases having an excellent test result through the comparison of modeled test results between optimum cases and test cases in a generation, so that cases having a more excellent test result are sorted out generation after generation. Accordingly, when the number of generations increases, cases having a most excellent test result remain from the tens of trillions of cases.

As described above, according to some exemplary embodiments, a test device randomly generates cases and sorts out cases having an excellent test result, thereby extracting optimum cases providing high yield and reliability from a broad coverage.

While exemplary embodiments have been particularly shown and described, it will be understood by those of ordinary skill in the art that various changes in forms and details may be made therein without departing from the spirit and scope of the inventive concept as defined by the following claims.

What is claimed is:

1. A method of testing a semiconductor memory device, the method comprising:
performing a test on the semiconductor memory device according to a plurality of test cases corresponding to a first generation and generating modeled test results for the plurality of cases;
determining optimum cases from among the plurality of cases based on the modeled test results; and
generating a plurality of test cases corresponding to a second generation based on the optimum cases.

2. The method of claim 1, wherein n optimum cases are determined, and
wherein the generating the plurality of cases corresponding to the second generation comprises:
generating a medium case based on at least one case among the n optimum cases except for a k-th optimum case, where n is an integer of at least 2, and k is an integer of at least 1 and at most n; and
generating a test case by recombining the medium case with the k-th optimum case.

3. The method of claim 2, wherein the plurality of cases corresponding to the second generation comprise the optimum cases and test cases respectively corresponding to the optimum cases.

4. The method of claim 1, wherein each of the plurality of cases corresponding to the first generation comprises a plurality of operating conditions, and the semiconductor memory device comprises a plurality of memory blocks, and
wherein the performing the test and the generating the modeled test result comprises:
mapping operating conditions of each of the plurality of cases corresponding to the first generation to universal internal bus (UIB) information;
generating a test program for each of the plurality of cases using the mapped operating conditions;
performing a test on a memory block of the semiconductor memory device according to the test program; and
analyzing a result of the performing the test on the memory block and generating the modeled test result.

5. The method of claim 4, wherein the generating the test program comprises generating the test program so that when a number of test times that the test is performed on a memory cell in the memory block to be tested is greater than a normal operating period, the test is performed on another memory block.

6. The method of claim 1, wherein the plurality of cases corresponding to the first generation comprise optimum cases of a previous generation before the first generation and test cases respectively corresponding to the optimum cases of the previous generation, and
the determining the optimum cases based on the modeled test results comprises:
comparing a modeled test result corresponding to each of the optimum cases of the previous generation with a modeled test result corresponding to one of the test cases respectively corresponding to the optimum cases of the previous generation; and
determining the optimum cases for the first generation according to a result of the comparing.

7. The method of claim 1, wherein the performing the test and the generating the modeled test result comprises not performing a test on cases that have already been generated before the first generation among the plurality of cases corresponding to the first generation.

8. The method of claim 1, wherein each of the modeled test results comprises a distribution characteristic of the semiconductor memory device.

9. A method of testing a semiconductor memory device, the method comprising:
    determining optimum cases based on a modeled test result corresponding to a result of performing a test on the semiconductor memory device based on a plurality of cases corresponding to a first generation; and
    generating a plurality of cases corresponding to a second generation based on the optimum cases,
    wherein the plurality of cases corresponding to the first generation comprise optimum cases of a previous generation before the first generation and test cases respectively corresponding to the optimum cases of the previous generation, and
    the determining the optimum cases comprises:
    comparing a modeled test result corresponding to the optimum cases of the previous generation with a modeled test result corresponding to the test cases respectively corresponding to the optimum cases of the previous generation; and
    determining the optimum cases for the first generation according to a result of the comparing.

10. The method of claim 9, wherein the method is performed iteratively through a plurality of generations, and
    the determining the optimum cases according to the result of the comparing comprises outputting the optimum cases as final optimum cases when the generation is a p-th generation, where p is a positive integer.

11. The method of claim 9, wherein n optimum cases for the first generation are determined, and the generating the plurality of cases corresponding to the second generation comprises:
    generating a medium case based on at least one case among the n optimum cases except for a k-th optimum case, where n is an integer of at least 2, and k is an integer of at least 1 and at most n; and
    generating each of the test cases by recombining the medium case with the k-th optimum case.

12. The method of claim 11, wherein the plurality of cases corresponding to the second generation comprise the optimum cases and the test cases respectively corresponding to the optimum cases.

13. The method of claim 9, wherein each of the plurality of cases corresponding to the first generation comprises a plurality of operating conditions, and the semiconductor memory device comprises a plurality of memory blocks, and
    wherein the modeled test result is generated by mapping operating conditions of each of the plurality of cases corresponding to the first generation to universal internal bus (UIB) information, generating a test program for each of the plurality of cases using the mapped operating conditions, performing a test on a memory block of the semiconductor memory device according to the test program, and analyzing a result of performing the test and generating the modeled test result.

14. The method of claim 13, wherein the test program is generated so that when a number of test times that the test is performed on a memory cell in the memory block to be tested is beyond a normal operating period, the test is performed on another memory block.

15. The method of claim 9, wherein the modeled test result comprises a distribution characteristic of the semiconductor memory device.

16. A method of testing a semiconductor memory device, the method comprising:
    randomly generating a plurality of test cases within a specified range of values; and
    performing a plurality of iterations of the following:
        performing a test on the semiconductor memory device according to the plurality of test cases and generating a plurality of modeled test results for the plurality of test cases;
        determining a plurality of optimum test cases from among the plurality of test cases based on the plurality of modeled test results; and
        generating a plurality of new test cases based on the plurality of optimum test cases.

17. The method of claim 16, wherein the determining the plurality of optimum cases based on the plurality of modeled test results comprises:
    comparing a modeled test result corresponding to each of the plurality of optimum test cases of a previous iteration with the plurality of modeled test results corresponding to the plurality of test cases of a current iteration; and
    determining the plurality of optimum test cases for the current iteration according to a result of the comparing.

18. The method of claim 17, wherein the generating the plurality of new test cases comprises:
    generating plurality of mutated test cases using the plurality of optimum test cases except for a k-th optimum test case, where k is a positive integer; and
    generating the plurality of new test cases by recombining each mutated test case with its corresponding k-th optimum test case.

19. The method of claim 18, wherein the plurality of new test cases further comprises the plurality of optimum test cases.

20. The method of claim 19, wherein p iterations are performed, where p is a positive integer, and the method further comprises:
    outputting the plurality of optimum test cases as final optimum test cases after the p-th iteration is performed.

* * * * *